(12) United States Patent
Hill et al.

(10) Patent No.: US 11,357,096 B2
(45) Date of Patent: Jun. 7, 2022

(54) PACKAGE SUBSTRATE INDUCTOR HAVING THERMAL INTERCONNECT STRUCTURES

(71) Applicant: Intel Corporation, Santa Clara, CA (US)

(72) Inventors: Michael J. Hill, Gilbert, AZ (US); Huong T. Do, Chandler, AZ (US); Anne Augustine, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 824 days.

(21) Appl. No.: 16/027,737

(22) Filed: Jul. 5, 2018

(65) Prior Publication Data
US 2020/0015348 A1 Jan. 9, 2020

(51) Int. Cl.
| | |
|---|---|
| *H05K 1/00* | (2006.01) |
| *H05K 1/02* | (2006.01) |
| *H05K 1/16* | (2006.01) |
| *H01L 23/367* | (2006.01) |
| *H01L 23/498* | (2006.01) |
| *H01F 27/28* | (2006.01) |

(Continued)

(52) U.S. Cl.
CPC ....... *H05K 1/0204* (2013.01); *H01F 27/2804* (2013.01); *H01F 41/041* (2013.01); *H01L 21/486* (2013.01); *H01L 21/4857* (2013.01); *H01L 23/367* (2013.01); *H01L 23/49827* (2013.01); *H01L 23/49838* (2013.01);
(Continued)

(58) Field of Classification Search
CPC ...... H05K 1/0204; H05K 1/165; H05K 1/181; H05K 2201/09672; H05K 2201/1003; H05K 2201/10166; H05K 2201/10515; H05K 2201/10734; H01F 27/2804; H01F 41/041; H01F 2027/2809; H01L 21/4857; H01L 21/486; H01L 23/367; H01L 23/49827; H01L 23/49838
See application file for complete search history.

(56) References Cited

U.S. PATENT DOCUMENTS

| | | | | |
|---|---|---|---|---|
| 7,339,798 | B2* | 3/2008 | Chakravorty | ........... H01L 23/50 361/782 |
| 9,515,003 | B1* | 12/2016 | Fitzgerald | ............... H01L 28/10 |

(Continued)

FOREIGN PATENT DOCUMENTS

KR 20180070279 6/2018

OTHER PUBLICATIONS

International Search Report and Written Opinion for PCT Application No. PCT/US19/35120, dated Sep. 20, 2019.

(Continued)

*Primary Examiner* — Pete T Lee
(74) *Attorney, Agent, or Firm* — Essential Patents Group, LLP.

(57) ABSTRACT

Embodiments include a microelectronic device package structure having an inductor within a portion of a substrate, wherein a surface of the inductor is substantially coplanar with a surface of the substrate. One or more thermal interconnect structures are on the surface of the inductor. A conductive feature is embedded within a board, where a surface of the conductive feature is substantially coplanar with a surface of the board. One or more thermal interconnect structures are on the surface of the conductive feature of the board, where the thermal interconnect structures provide a thermal pathway for cooling for the inductor.

18 Claims, 11 Drawing Sheets

(51) Int. Cl.
  *H01F 41/04*     (2006.01)
  *H01L 21/48*     (2006.01)
  *H05K 1/18*      (2006.01)

(52) U.S. Cl.
  CPC ............ *H05K 1/165* (2013.01); *H05K 1/181* (2013.01); *H01F 2027/2809* (2013.01); *H05K 2201/09672* (2013.01); *H05K 2201/1003* (2013.01); *H05K 2201/10166* (2013.01); *H05K 2201/10515* (2013.01); *H05K 2201/10734* (2013.01)

(56) References Cited

U.S. PATENT DOCUMENTS

| | | |
|---|---|---|
| 2004/0097015 A1 | 5/2004 | Sharma |
| 2007/0090912 A1* | 4/2007 | Lee .................... H01F 17/0013 336/200 |
| 2012/0228755 A1* | 9/2012 | Nagano ............ H01L 23/49827 257/E23.188 |
| 2014/0002223 A1 | 1/2014 | Sainz |
| 2014/0131847 A1 | 5/2014 | Yee et al. |
| 2015/0214192 A1 | 7/2015 | Lin |
| 2015/0302974 A1 | 10/2015 | Zhao et al. |
| 2016/0150649 A1* | 5/2016 | Peng ................. H01L 23/49827 438/126 |
| 2017/0064837 A1* | 3/2017 | Li ....................... H01L 21/4857 |
| 2017/0092556 A1* | 3/2017 | Gustafson ............... H01C 7/18 |
| 2018/0174994 A1 | 6/2018 | Choi et al. |
| 2020/0344881 A1* | 10/2020 | Tonaru .................. H05K 1/181 |

OTHER PUBLICATIONS

International Preliminary Report on Patentability for PCT Application No. PCT/US19/35120, dated Jan. 14, 2021.

* cited by examiner

PACKAGE SUBSTRATE INDUCTOR HAVING THERMAL INTERCONNECT STRUCTURES

TECHNICAL FIELD

Embodiments of the present description generally relate to the field of microelectronic packaging, and, more particularly, to microelectronic packages having inductors with thermal interconnects.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. Mobile products, such as cell phones, for example, often have microelectronic packages which include high power devices. Package structures supporting such high-power devices need to possess mechanical and thermal properties that can manage high power device operational requirements. Integrated circuit dies associated with package structures may comprise a portion of a voltage regulator circuitry, where voltage and current requires precise control of current and voltage during operation. For example, a die, such as a processor die, may be on/within a package substrate, and may be electrically coupled to an embedded inductor within a package substrate.

Such inductors which are coupled with die circuitry may limit processor current level capabilities, in order to avoid damage to the inductors caused by exceeding inductor current limits. This reduction in processor current levels results in reduced processor performance because the processor may be capping its current level, or time in a turbo mode to accommodate inductor current limits.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
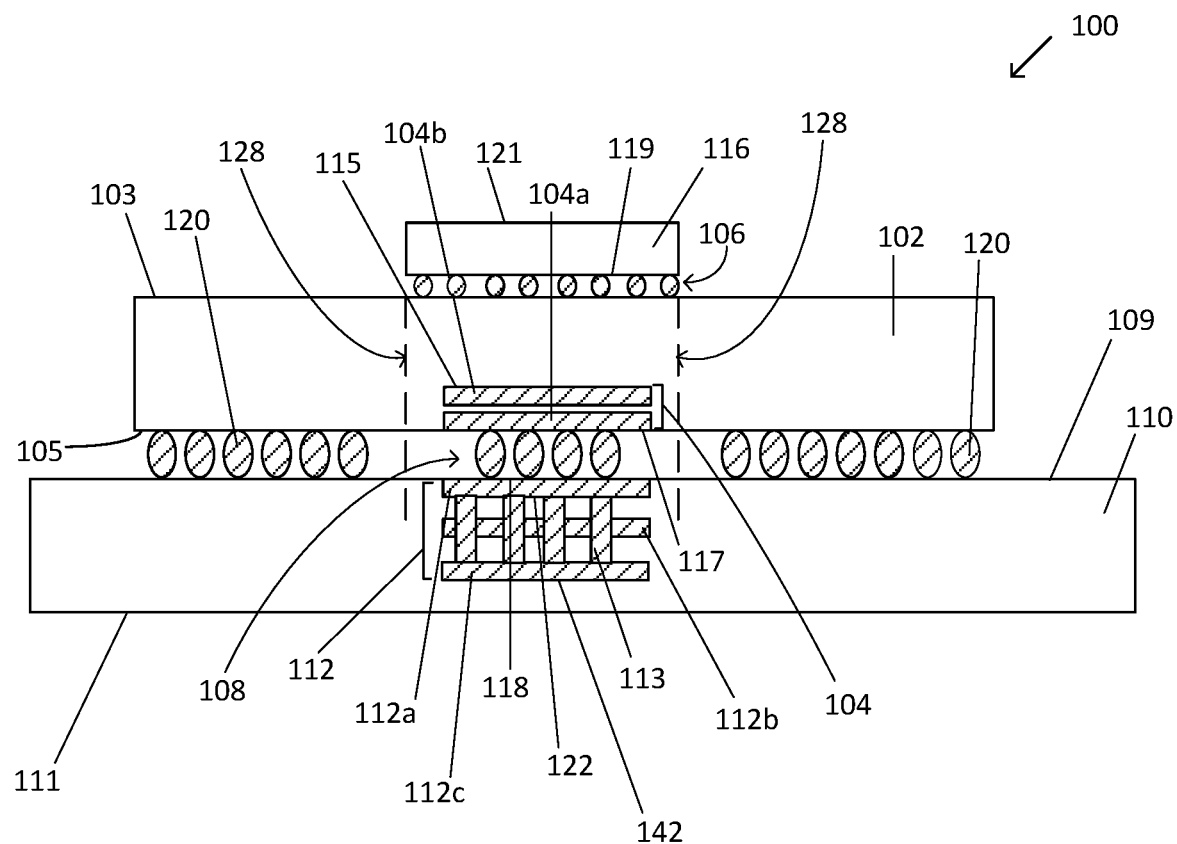
FIG. 1A illustrates a cross-sectional view of a package structure having thermal interconnect structures, according to embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

Various implementations of the embodiments herein may be formed or carried out on a substrate, such as a package substrate. In some embodiments, a package substrate may comprise any suitable type of substrate capable of providing electrical communications between an electrical component, such as an integrated circuit (IC) die, and a next-level component to which an IC package may be coupled (such as a circuit board, for example). In other embodiments, the substrate may comprise any suitable type of substrate capable of providing electrical communication between an IC die and an upper IC package coupled with a lower IC/die package, and in some embodiments, a substrate may comprise any suitable type of substrate capable of providing electrical communication between an upper IC package and a next-level component to which an IC package is coupled.

A substrate may also provide structural support for a device, such as a die. By way of example, in some embodiments, a substrate may comprise a multi-layer substrate—including alternating layers of a dielectric material and metal—built-up around a core layer (either a dielectric or a metal core), and may include through via structures that extend through the core. In other embodiments, a substrate may comprise a coreless multi-layer substrate, in which case through via structures may be absent. Other types of substrates and substrate materials may also find use with the disclosed embodiments (e.g., ceramics, sapphire, glass, etc.). Further, according to some embodiments, a substrate may comprise alternating layers of dielectric material and metal that are built-up over a die itself—this process is sometimes referred to as a "bump-less build-up process." Where such an approach is utilized, conductive interconnects may or may not be needed (as the build-up layers may be disposed directly over a die/device, in some cases).

A die may include a front-side and an opposing back-side, and may be an integrated circuit die and/or an integrated circuit device, in some embodiments. In some embodiments, the front-side may be referred to as the "active surface" of the die. A number of interconnects may extend from the die's front-side to an underlying substrate, and these interconnects may electrically couple the die and substrate. In some cases, a die may be directly coupled to a board, such as a motherboard. Interconnects/traces may comprise any type of structure and materials capable of providing electrical communication between a die and substrate/board. In some embodiments, a die may be disposed on a substrate in a flip-chip arrangement. In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be on the terminals of a substrate and/or die, and these terminals may then be joined using a solder reflow process, for example. Of course, it should be understood that many other types of interconnects and materials are possible (e.g., wirebonds extending between a die and a substrate). In some embodiments herein, a die may be coupled with a substrate by a number of interconnects in a flip-chip arrangement. However, in other embodiments, alternative structures and/or methods may be utilized to couple a die with a substrate.

Described herein are microelectronic packaging structures having an inductor at least partially embedded in a substrate, and where a die, which may comprise an integrated circuit die, may be on a first side of the substrate. The inductor may comprise an air core inductor. In an embodiment, the air core inductor may comprise a series of conductive coils/windings, which surround a non-ferromagnetic material, such as a dielectric material, for example, and do not possess a ferromagnetic core material. The inductor described herein, may be electrically coupled to voltage regulator circuitry located in the die, where the die and the associated voltage regulator circuitry may comprise portion of a voltage regulator. In an embodiment, the voltage regulator may comprise a fully integrated voltage regulator (FIVR).

In an embodiment, a surface of the inductor is substantially coplanar with a second side of the substrate. A board, such as a motherboard, for example, may comprise one or more board conductive features. In an embodiment, a surface of a board conductive feature is substantially coplanar with a first side of the board. Thermal interconnect structures, such as solder balls, for example, may be thermally coupled to a surface of the inductor and may be thermally coupled to a surface of the board conductive feature, whereby the board is thermally coupled to the substrate. In an embodiment, the inductor comprises a geometry that is a mirror image of a geometry of the board conductive feature. For example, a portion of the inductor that is thermally coupled to a portion of the board conductive feature may comprise a length and a width. A length and a width of the board conductive feature is substantially equal to the inductor portion length and width. By incorporating the thermal interconnect structures between the inductor and the board interconnect features, a temperature of the inductor may be cooled to allow larger currents and more power to be delivered to the die during peak current demand while the device is operational.

Some embodiments include a substrate with a die, which may be an integrated circuit die, where the die is on a first side of the substrate. An inductor may be on a second side of the substrate, opposite the first side of the substrate. The inductor may have a surface that is substantially coplanar with the second side of the substrate, and may be at least partially embedded within the substrate. One or more thermal interconnect structures may be on the surface of the inductor. A board may be physically and electrically with the second side of the substrate. The board may comprise one or more board conductive features, where the board conductive features may be at least partially embedded within the board. A surface of a portion of the board conductive feature may be substantially coplanar with the first side of the board. The one or more thermal interconnect structures may be between the surface of the portion of the board conductive feature and the surface of the inductor.

FIG. 1A is a cross-sectional view of a package structure 100, arranged in accordance with some embodiments of the present disclosure, having thermal interconnect structures disposed between a package substrate and a board. The package structure 100 includes one or more die 116 electrically and physically coupled to a first side 103 of a portion of a substrate 102. The substrate 102 may comprise a portion of a system in package substrate, a printed circuit board, or any other suitable substrate according to a particular application. The substrate 102 may include such materials as phenolic cotton paper (e.g., FR-1), cotton paper and epoxy materials (e.g., FR-3), woven glass materials that are laminated together using an epoxy resin (e.g., FR-4), glass/paper with epoxy resin (e.g., CEM-1), glass composite with epoxy resin, woven glass cloth with polytetrafluoroethylene (e.g., PTFE CCL), or other polytetrafluoroethylene based prepreg material.

The substrate 102 may include conductive interconnect structures/routing layers (not shown) that are within dielectric layer(s), which may be configured to route electrical signals between any number of die 116 and the substrate 102, in some embodiments. For example, interconnect structures may include routing structures such as pads or traces configured to receive electrical signals to and from devices that may be on or within the substrate 102. In some embodiments, individual ones of the conductive interconnect structures/routing layers comprise trenches, ground planes, power planes, re-distribution layers (RDLs), and/or any other appropriate electrical routing features. The dielectric layers and the conductive layers/structures within and on the dielectric layers of the substrate 102 are sometimes referred to as a "package substrate." The substrate 102 may also provide structural support for discrete components and/or any other type of device electrically coupled to the substrate 102.

Various types of substrates and substrate materials may find use with the disclosed embodiments (e.g., ceramics, sapphire, glass, etc.). The substrate 102 may be any substrate known to be suitable for one or more of flip-chip packages (FCBGA), package-on-package (PoP), system-in-package (SiP), or the like. The substrate 102 may further include interconnect structures (not shown) such as solder balls, on a second side 105, opposite the first side 101 of the substrate 102, which may couple the package structure 100 to a motherboard 110, or any other suitable type of board, for example.

The die 116 may be an integrated circuit, or any other type of suitable die. In some embodiments, the die 116 may be any type of die which consumes a large amount of power, such as a die requiring more 1 Watt to operate (such as a system on a chip) for example. Such die may generate a significant amount of heat, and may require sufficient cooling to maintain an acceptable operating environment, in order to avoid adversely affecting the operations of the die 116, and possibly neighboring die/components that may be adjacent the die 116 on the substrate 102.

The die 116 may be any type of integrated device or integrated component that may be included within an electronic device package. In some embodiments, the die 116 includes a processing system (either single core or multi-core). In some embodiments, the die 116 may be a microprocessor, a graphics processor, a signal processor, a network processor, a chipset, a memory device etc. In some embodiments, the die 116 be a system-on-chip (SoC) having multiple functional units (e.g., one or more processing units, one or more graphics units, one or more communications units, one or more signal processing units, one or more security units, etc.). The die 116 may comprise circuitry related to voltage regulation, and may comprise circuitry to precisely control voltage supplied to the package structure 100, and allows parts of the die to be turned off or turned down to save power and to reduce the generation of heat.

In some embodiments, the die 116 may be attached to the first side 103 of the substrate 102 according to a variety of suitable configurations including a flip chip configuration, or any other suitable attachment configuration. In the flip chip configuration, a first side 119 of the die 116 may be an active side 119 of the die 116, and may be attached to the first side 103 of the substrate 102, using interconnect features 106, which may comprise such conductive features as bumps or pillars, which serve to route electrical signals, such as I/O, power and/or ground signals, associated with the operation of the die 116. In some embodiments, the wire bonding or the flip chip connections may comprise conductive materials such as copper, gold and nickel. A second side 121 of the die 116 is opposite the first side 119. The second side 121 of the die 116 may be coupled to a thermal solution, such as a heat spreader, for example (not shown).

In an embodiment, solder connections 120, which are adjacent a footprint 128 of the die 116, may electrically couple the second side 105 of the substrate 102 to a first side 109 of the board 110, where the board 110 may be a motherboard, a printed circuit board, or any other suitable type of board substrate 110. One or more inductors 104 may be at least partially embedded within the substrate 102, and may be located beneath the die shadow, and within a die footprint 128. The inductor 104 may comprise a first side 117 and a second side 115. The inductor 104 may comprise any number of conductive layers (windings), such as a first conductive layer 104*a* and a second conductive layer 104*b*. In an embodiment, the conductive layers 104*a*, 104*b* of the inductor 104 may comprise copper, or any other suitable conductive material. The inductor 104 may comprise an air core inductor (ACI) in an embodiment, and may comprise a portion of an integrated voltage regulator, such as a fully integrated voltage regulator for example. The inductor 104 may be electrically coupled to the die 116 voltage regulator circuitry by electrical traces within the die 116 (not shown). In an embodiment, the die 114 may comprise at least one capacitor that is electrically coupled with the inductor 104, where the capacitor within the die and the inductor 104 comprise a portion of a FIVR.

Figure 1B:
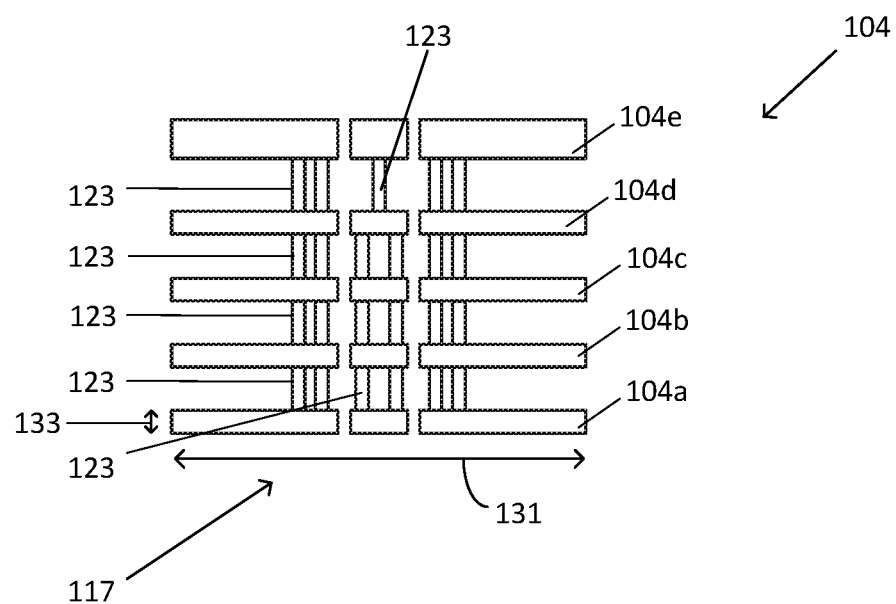
FIG. 1B illustrates a cross-sectional view of an inductor structure, according to embodiments.
Figure 1C:
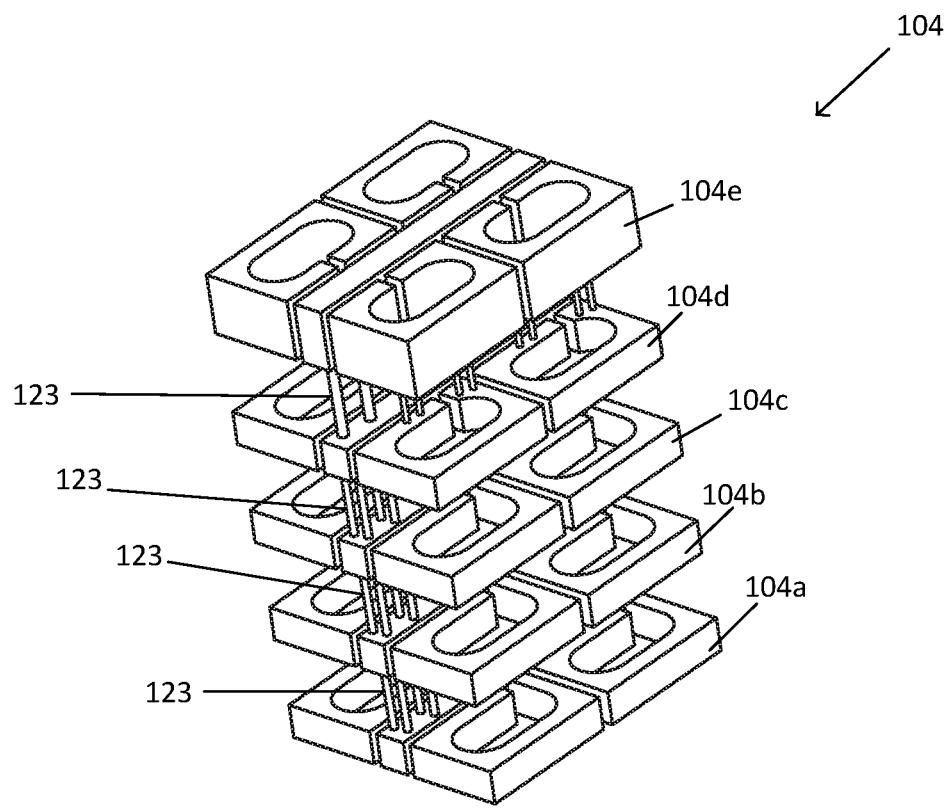
FIG. 1C illustrates a side perspective view of an inductor structure, according to embodiments.

FIG. 1B depicts a cross sectional view of an inductor 104, where the inductor 104 comprises five conductive layers 104*a*, 104*b*, 104*c*, 104*d*, 104*e*, in an embodiment. In an embodiment, the conductive layers 104*a*-104*e* may comprise windings of the ACI, which may be connected in series, such that the output of one layer is the input of the next. Vias 123 physically and electrically couple each of the individual layers 104*a*-104*e* to each other. In some embodiments, the inductor 104 may comprise any number of conductive layers, and may comprise any number of vias 123 coupling individual conductive layers to each other. In an embodiment, a first side 117 of the first conductive layer of the inductor 104a (which may comprise a first side 117 of the inductor 104) may comprise a length 131, and a width 133. The length 131 and width 133 may vary according to the particular design of the inductor 104, and in some embodiments, a particular inductor 104 may comprise a variety of shapes, such as a circular shape, or an irregular shape, for example. FIG. 1C depicts a side perspective view of an embodiment of an inductor 104, wherein each of the individual layers 104a-104e are physically coupled to each other by the via structures 123.

Figure 1D:
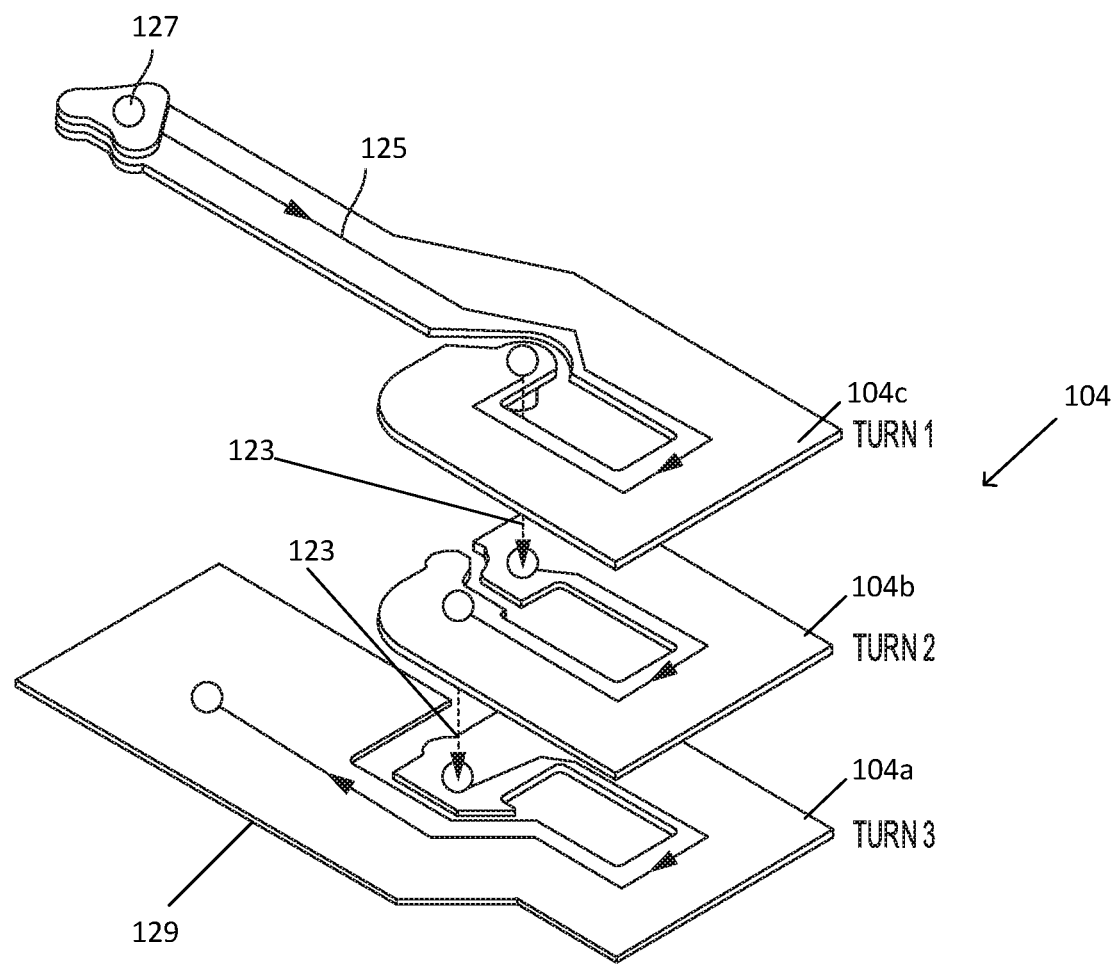
FIG. 1D illustrates a side perspective view of an inductor structure, according to embodiments.

FIG. 1D depicts a side perspective view of an embodiment of inductor structure 104, where the inductor 104 comprises conductive layers 104a, 104b, 104c, which may comprise turns of the inductor (turn 1, turn 2, turn 3, for example.) The inductor 104 conductive layers may comprise copper, or any suitable conductive material, and may be coupled to each other by one or more via structures 123, which are orthogonal to the plane of the conductive layers 104a-104c. A direct current (DC) current path 125 flows from a switch node located on the die 116, through the conductive layers 104a-104c. The conductive layer 104c is electrically coupled to the switch node connection 127. An output plane 129 may be coupled to the inductor 104 by an inductor conductive layer, such as layer 104a, where the output layer 129 may be connected to any suitable load, such as to a capacitor or another type of suitable load, in some embodiments. The inductor 104 and the die 116 comprise portions of a voltage regulator circuit, such as a FIVR circuit, in an embodiment.

Returning back to FIG. 1A, the second conductive layer 104b may be completely, or at least partially, embedded within the substrate 102, while the first conductive layer 104a may be at least partially exposed to the ambient environment. The second side of the first conductive layer 104a of the inductor 104 may be at least partially embedded within the substrate 102, while the first side/surface 117 of the first conductive layer 104a of the inductor 104a may be substantially coplanar with the second side 105 of the substrate 102. In an embodiment, the inductor 104 may be within the footprint 128 of the die 116.

In an embodiment, one or more thermal interconnect structures 108 may be directly on the first side 117 of the inductor 104 (which may comprise the exposed side of the first conductor layer 104a), and may be directly on exposed portions of one or more board conductive features 112, where the exposed portions/surface 118 of the one or more board conductive features 112 are substantially coplanar with the first side 109 of the board 110. The one or more board conductive features 112 may comprise a second side 142, that is embedded within the board 110. In an embodiment, the one or more thermal interconnect structures 108 may be adjacent to the solder balls 120. In an embodiment, the one or more thermal interconnect structures 108 may comprise a thermally conductive material, such as a material comprising high thermally conductivity. In an embodiment, each individual inductor 104 of the one or more inductors 104 may be thermally coupled to an individual plurality of thermal interconnect structures 108, or a plurality of inductors 104 may thermally share the same plurality of thermal interconnect structures 108. The thermal interconnect structures 108 possess the capability of being able to draw heat away from the one or more inductors 104, and direct the heat towards the board conductive features 112, thus cooling the inductor 104, and allowing the die 116 to operate at higher current levels and/or for longer periods of time.

In an embodiment, the thermal interconnect structures 108 may comprise a plurality of solder balls, and may be within the footprint 128 of the die 116. In an embodiment, the one or more thermal interconnect structures 108 may comprise any shape, such as a rectangular shape or a circular shape, for example. The thermal interconnect structures 108 may comprise a thermal conductivity of between about 5 W/mK to about 2000 W/mK, in some embodiments. The thermal interconnect structures 108 may comprise solder materials, such as tin, silver, gold, solder, nickel and conductive epoxy materials, in an embodiment. In other embodiments, the one or more thermal interconnect structures may comprise any material that provides a thermal pathway for cooling of the inductor 104, with which to reduce the temperature of the inductor 104 during device operation.

By providing cooling to the inductor 104, the inductor can be used with larger currents, allowing more power to be delivered to the die 116 (which may comprise one or more processors). Higher operational current levels enable a processor, such as a CPU of a microelectronic device, to increase performance. The total current that may be passed through an inductor, as described herein, is thus increased by the implementation of the thermal interconnect structures, and the inductor is protected from being damaged by excessive heat.

The embodiments described herein allow the CPU of a device to avoid throttling back by reducing current demand, and/or to avoid limiting the time the CPU is in a high current state. Both of these conditions, throttling back or limiting time, lead to product performance reductions because the CPU is capping its current or time in a turbo mode, for example, in order to accommodate the inductor current limits. The various embodiments included herein enable the inductor temperature to be maintained at acceptable levels during peak current demand.

The one or more thermal interconnect structures 108 may electrically and thermally couple the exposed surface 117 of the one or more inductors 104, which is located underneath the die shadow, with mirror image board conductive features 112 that are located within the board 110, and are also within the die shadow (within the footprint 128 of the die 116). In an embodiment, one or more board conductive features 112 are at least partially embedded within the board 110. In an embodiment, individual ones of the one or more board conductive features 112 may comprise one or more board conductive layers, such as a first 112a, a second 112b, and a third 112c conductive layer, for example. In an embodiment, a portion/surface of the first board conductive layer 112a, may be substantially coplanar with the first surface 109 of the board 110. The second board conductive layer 112b, is embedded within the board 110, and is below the first surface 109 of the board 110, and is below the first board conductive layer 112a. In an embodiment, the third board conductive layer 112c, may be embedded within the board 110 and may be below the second board conductive layer 112b.

The first, the second, and the third board conductive layers 112a, 112b, 112c, are physically and electrically coupled to each other by vertical via structures 113. The one or more board conductive features 112 may be comprised of conductive materials such as, but not limited to, one or more of copper, gold, lead, tin, nickel, or silver, for example. In some embodiments, the board conductive features 112 may comprise thermally conductive materials. In an embodiment, a first side 118 of the board conductive feature 112 (which may comprise the first side of the first board conductive layer 112a), is directly physically and thermally coupled to the one or more thermal interconnect structures 108. In an embodiment, the first side 118 of the first board conductive layer 112a, is substantially coplanar with the first side 109 of the board 110. A second side 142 of the first board conductive layer 112a, is embedded within the board 110.

Figure 1E:
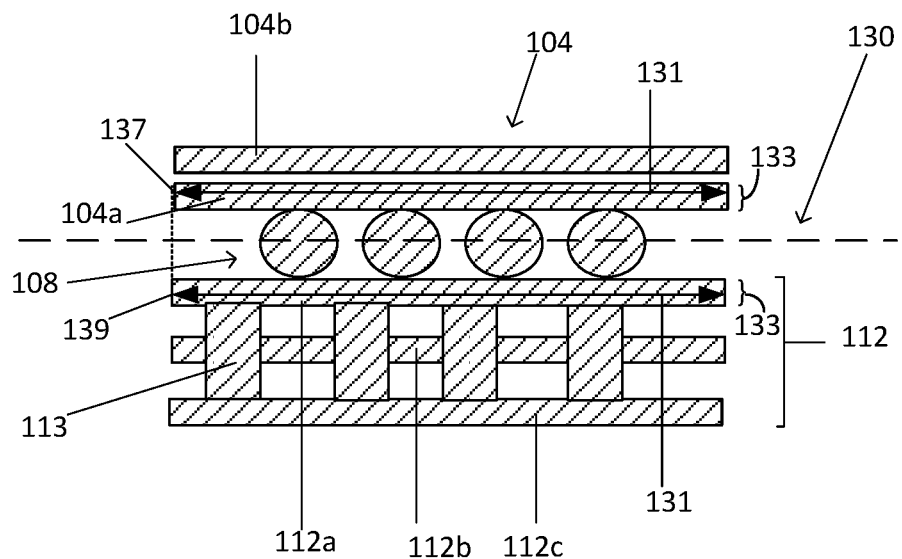
FIGS. 1E-1F illustrate cross-sectional views of a package structure having thermal interconnect structures, according to embodiments.

Both the shape of the exposed surface of the inductor 104 and the shape of the exposed board conductive feature 112 share substantially the same physical dimensions, in an embodiment. For example, in FIG. 1E, and inductor 104 comprises a first conductive layer 104a and a second conductive layer 104b, where the first conductive layer and the second conductive layer, 104a, 104b are physically and electrically coupled to each other by via structures (not shown). Board conductive features 112 may comprise a first, a second and a third board conductive layers 112a, 112b, and 112c located within the board 110. One or more thermal interconnect structures 108 are disposed between the first conductive layer 104a of the inductor 104 and the first board conductive layer 112a, in an embodiment. The first board conductive layer 112a is a mirror image of the first inductor conductive layer 104a, as reflected through a central plane 130 of the thermal interconnect structures 108, in an embodiment. In some embodiments, the first board conductive layer 112a and the first inductor conductive layer 104a may comprise any appropriate shape and/or materials, however they are mirror images of each other.

In an embodiment, a rectangular length 131 and a width 133 (thickness) of the first conductive layer 104a of the inductor 104 is substantially the same as a rectangular length 131 and width (thickness) 133 of the first board conductive layer 112a. In an embodiment, the thermal interconnect structures 108 may comprise a spherical geometry, as shown. In some embodiments, at least one sidewall of the inductor 104 conductive layers may be in alignment with at least one sidewall of the board conductive features 112. For example, a sidewall 137 of the first inductor conductive layer 104a may be in alignment with a sidewall 139 of the first board conductive layer 112a.

The inductor 104 is thermally coupled to the board conductive features 112 by the thermal interconnect structures 108, where the thermal interconnect structures 108 provide a thermal path to the board conductive features 112, which provides cooling for the inductor 104. By providing cooling to the inductor 104 the inductor 104 can be used with larger current, allowing more power to be delivered to the die/processor, thus resulting in increased CPU performance.

Figure 1F:
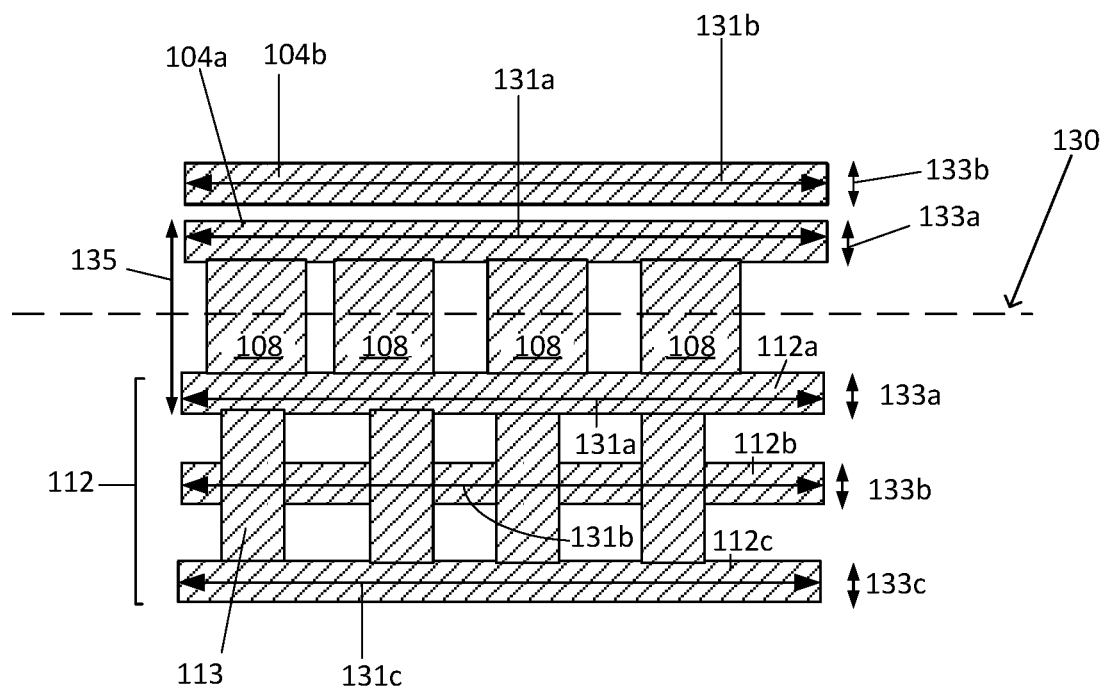

FIG. 1F depicts another embodiment, where the one or more thermal interconnect structures 108 comprise a rectangular shape. In an embodiment, the board conductive feature 112 may comprise a first conductive layer 112a comprising a first width 133a and a first length 131a, a second conductive layer 112b comprising a second width 133b and a second length 131b, and a third conductive layer 112c comprising a third width 133c and a third length 131c, where each conductive layer is physically and electrically coupled to each other by via structures 113. In an embodiment, the inductor 104 may comprise a first conductive layer 104a comprising a first width 133a and a first length 131a, and a second conductive layer 104b comprising a second width 133b and a second length 131b. The shape, (such as a length and/or a width) of the first inductor layer 104a is a mirror image of the shape of the first board conductive layer 112a, as reflected through a central plane 130 of the one or more thermal interconnect structures 108.

In an embodiment, the thermal interconnect structures 108 may comprise one or more conductive materials, such as, but not limited to, any suitable solder materials, copper, tin, gold, or nickel, in some embodiments, as well as comprising thermally conductive materials. In an embodiment, the inductor conductive layers and the board conductive layers may include one or more conductive materials, such as, but not limited to, copper, tin, gold or nickel, for example.

The thermal interconnect structures provided herein enhance thermal dissipation within the package substrate 102. The embodiments herein provide additional thermal dissipation for a CPU, as well as providing for a reduction of DC resistance of the inductor, thus improving the performance of the CPU. In an embodiment, the inductor structures 104 are capable of carrying an increased amount of current and allow for increased current levels to be delivered to the CPU, which in turn increases CPU performance. The embodiments herein include adding thermal interconnect structures, which may comprise any suitable shape or size, such as circular shapes, rectangular shapes, that may be comprised of any suitable thermally conductive materials, in between one or more inductor structures and a board. The thermal interconnect structures described herein, are located within the substrate in parallel with the inductor current flow, so that the thermally conductive interconnect structures reduce a direct-current (DC) resistance of the inductor, but do not dramatically alter the overall inductance of the inductor. The thermal interconnect structures provided herein are able to provide thermal conduction away from the inductor, thus reducing the overall inductor temperature and increasing the inductor current capacity.

Figure 2:
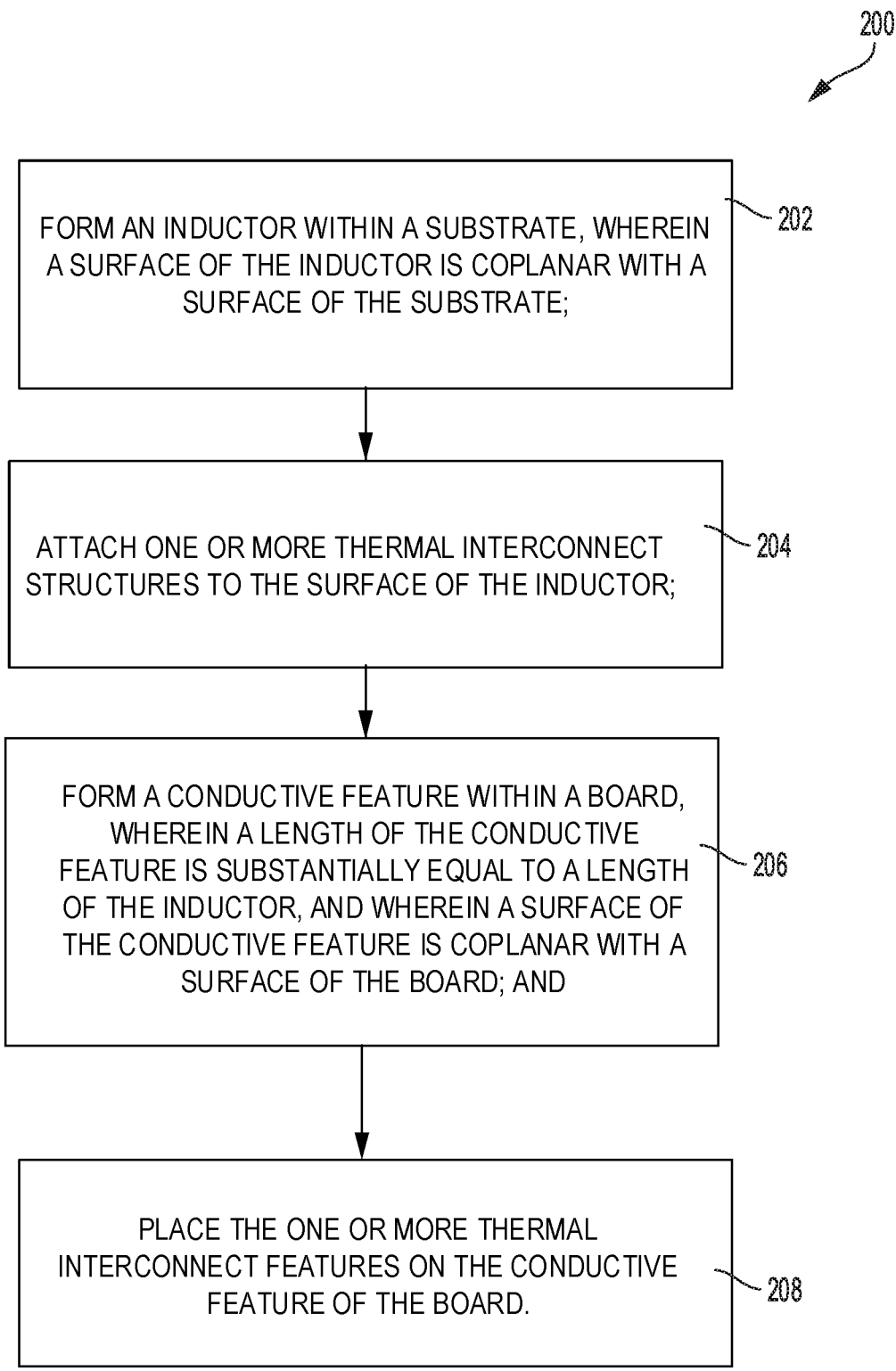
FIG. 2 is a flow diagram illustrating a method of fabricating package structures having thermal interconnect structures, according to embodiments.

FIG. 2 depicts a flow chart of an embodiment of a method 200 of forming thermal interconnect structures between an inductor disposed within a package substrate, and a board. The thermal interconnect structures provide thermal cooling for the inductor, and thus for voltage regulator circuitry coupled to a die that may be disposed on the package substrate. The method 200 may share any or all characteristics with any other methods discussed herein, such as, but not limited to, the methods disclosed in FIGS. 3A-3G. For example, FIGS. 3A-3G may show cross-sectional views of structures employing any of the operations described in method 200. It should be noted that the order of the operations of method 200 may be varied, according to a particular application.

At operation 202, an inductor is formed within a substrate, where a surface of the inductor is substantially coplanar with the first side of the substrate. The inductor may be formed within a recess of the substrate. A die such as a processor die, may be attached (either initially or subsequently) to a first side of the substrate, opposite a second side of the substrate. The die may include any type of die, such as a processor die, or a memory die, for example, and may comprise voltage regulator circuitry. A recess may be formed in the second side of the substrate. The recess may be formed by utilizing a dielectric etch, where a portion of the package substrate may be removed to accommodate the dimensions of the inductor. Any suitable removal process may be used to form the recess, such as an etching process, for example. An inductor may be formed within the recess of the second side of the substrate. The inductor may comprise conductive windings/layers, in an embodiment.

In an embodiment, the inductor may be formed to comprise any number of conductive layers, where the layers of conductive material may be formed within the recess. The conductive layers of the inductor may be formed utilizing such processes as plating process, and/or physical vapor deposition processes, for example. The conductive material may be patterned and etched using any suitable lithographic techniques, such as laser etching or drilling processes, for example.

Via structures may be formed between each successive conductive layer, and may electrically physically couple each inductor layer with each other. A first surface of the inductor is formed such that it is substantially coplanar with the second side of the substrate, such that the first layer of the inductor is exposed and partially external to the package substrate. A second surface of the inductor is at least partially embedded within the package substrate material. The conductive layers of the inductor may comprise a conductive material such as a metal, and may include copper, aluminum or gold, for example, and may be in the shape of pillars or lands, in some cases. A plurality of interconnect features may be formed adjacent the inductor, on the second surface of the substrate. The plurality of interconnect features may comprise conductive bumps, such as C4 bumps or balls, or wire structures, in some embodiments. The plurality of interconnect features may be formed in any variety of manners, such as, but not limited to plating processes, printing and reflow processes or wire bonding, for example.

The inductor may be an ACI inductor in an embodiment, and in other embodiments, the inductor may comprise any suitable type of inductor for a particular application. Conductive traces may be formed within the package substrate with which to couple the inductor to the die. In some embodiments, more than one die may be attached to the first side of the substrate. The conductive traces may couple the inductor to portions of a voltage regulator circuitry that may reside within the die. The inductor may comprise a portion of the voltage regulator circuitry. The inductor may comprise a portion of a FIVR circuitry.

At operation 204, one or more thermal interconnect structures may be formed on an exposed surface of the inductor. The one or more thermal interconnect structures may be formed by using any suitable metallization process, for example, such as plating, or physical vapor deposition. The thermal interconnect structures may comprise a thickness of between about 100 to about 800 microns in an example. The thermal interconnect structures are formed within a footprint of the die. The thermal interconnect structures may be comprised of any suitable thermally conductive materials, such as copper, nickel, solder or conductive epoxy materials, and may comprise a thermal conductivity of between about 5 W/mK to about 2000 W/mK in some cases. The thermal interconnect structures may comprise any suitable shape, such as circular solder ball shape, or may comprise a rectangular shape, such as, but not limited to, a pillar shape, for example. The thermal interconnect structures may be attached to the inductor surface in any variety of manners. For example, the thermal interconnect structures may be attached by utilizing a solder reflow process, where the thermal interconnect structures may be reflowed utilizing mass reflow, or thermal compression bonding, in some embodiments.

At operation 206, one or more conductive features may be formed within a board, such as a printed circuit board, or a motherboard, for example. A recess may initially be formed in the board where the board conductive features are to be formed. Any suitable formation process may be utilized to form the conductive structures within the board, such as physical vapor deposition and/or many suitable plating process such as an electroplating process. The board conductive features may be comprised of any suitable thermally and/or electrically conductive materials, such as copper, nickel, gold, solder and/or conductive epoxy materials, and may comprise a thermal conductivity of between about 5 W/mK to about 2000 W/mK in some cases.

The board conductive features may comprise any suitable shape, such as a rectangular shape, for example. The board conductive features are formed such that the geometry of the board conductive structures is a mirror image of the geometry of the inductor. For example, the inductor may comprise a first layer with a length and width, that may comprise a rectangular shape. The conductive board feature may comprise a first layer that may have substantially the same length and thickness as the thickness and length of the first layer of the inductor.

In an embodiment, a first board conductive layer may be formed within the board recess, and any additional layers/structures may be formed upon the first board layer. Via structures may be formed to couple individual board conductive layers with each other, and may be vertically disposed between the various board conductive layers. In an embodiment, a first layer of the board conductive feature may be substantially coplanar with a surface of the board.

At operation 208, the substrate may be physically attached to the board, where the thermal interconnect structures are placed on the surface of the board conductive features. interconnect structures. Both the thermal interconnect structures and the board interconnect structures are within the footprint of the die. The inductor is also within the footprint of the die. A plurality of interconnect structures may be adjacent the thermal interconnect structures on the second surface of the substrate, and may electrically couple the substrate to the board. Optionally, the die may be attached subsequent to the attachment of the board to the substrate. The die may comprise circuitry for the voltage regulation, where the inductor comprises a portion of the voltage regulator circuitry.

The one or more thermal interconnect structures provide thermal cooling for a voltage regulator circuit of a processor die attached to the substrate. The die may comprise a first side and an opposing second side, where the second side of the die may be attached to the first side of the substrate, opposite the inductor. The attached die may have a plurality of interconnect features, such as a plurality of solder balls, on the second side of the die, which may be an active side of the die, in some embodiments. The plurality of interconnect features may comprise metals, such as copper, solder, aluminum and/or gold, for example, and may be in the shape of pillars or lands, in some cases. The plurality of interconnect features may be conductive bumps, such as C4 bumps or balls, or wire structures, in some embodiments. The plurality of interconnect features may be formed in any variety of manners, such as, but not limited to plating processes, printing and reflow processes or wire bonding, for example.

By forming the thermal interconnect structures between the substrate and the board underneath the die footprint, a thermal path is created for the inductor to be cooled, thus allowing an attached die comprising voltage regulator circuitry to operate at higher current levels and/or longer times at higher current levels. Thus, embodiments included herein enable an inductor, such as an ACI, to be used with larger currents, allowing more power to be delivered to the CPU, resulting in increased CPU performance. The total current of the CPU may be increased, and the necessity of capping CPU current or time while in a turbo mode, for example, may be reduced.

Figure 3A:
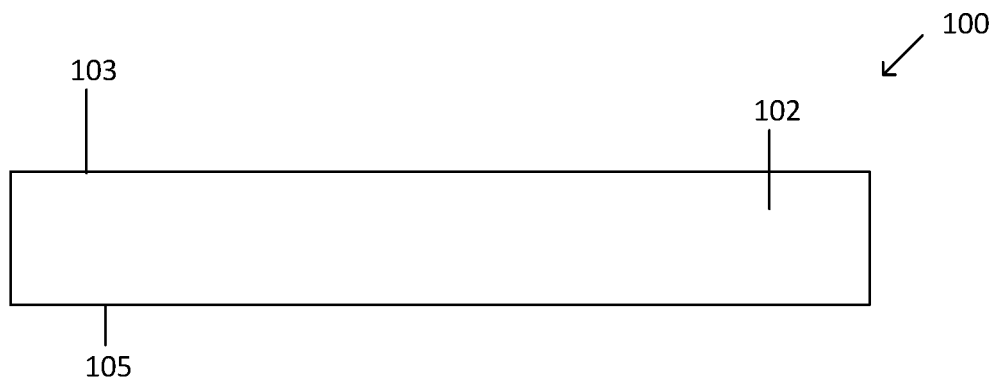
FIGS. 3A-3G illustrate cross-sectional views of package structures formed according to methods of fabricating package structures having thermal interconnect structures, according to embodiments.

FIGS. 3A-3F depict cross-sectional views of structures formed by employing a process of fabricating package device structures comprising thermal interconnect structures between an embedded inductor and a board, such as a motherboard for example. The thermal interconnect structures provide cooling for the inductor, which enables higher current operation for a die/processor attached to the package structure. In FIG. 3A, a portion of a substrate is depicted. In an embodiment the substrate 102 may comprise a first side 103 and a second side 105. The substrate 102 may comprise a package substrate, in an embodiment. The substrate 102 may comprise a dielectric material with any number of conductive circuitry traces embedded therein. A recess (not shown) may be formed on the second side 105 of the substrate 102, by using any suitable etching process, such as an etching process, and/or a drilling process, for example.

Figure 3B:
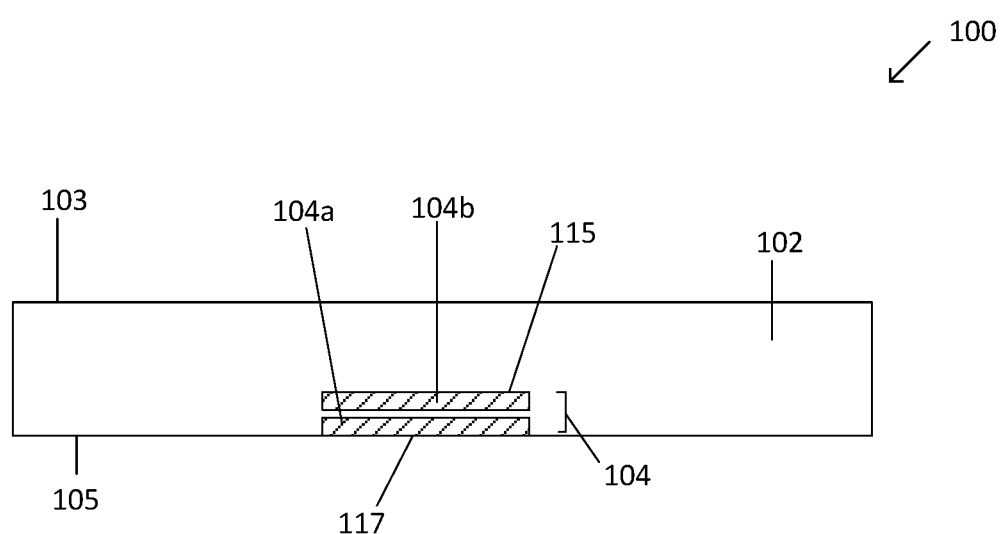

In FIG. 3B, an inductor 104, may be formed within the substrate 102. A surface/first side 117 of the inductor 104 may be exposed and may be substantially coplanar with the second side 105 of the substrate. A second side 115 of the inductor 104 may be embedded within the substrate 102. In an embodiment, the inductor 104 comprises a first conductive layer 104a and a second conductive layer 104b. The conductive layers 104a, 104b of the inductor 104 may be formed by physical deposition and/or any suitable plating process, such as an electroplating process for example. The first conductive layer 104a may comprise a thickness and a width, which may vary according to the particular application. The second conductive layer 104b may comprise a thickness and a width that is the same thickness and width as the first conductive layer 104a of the inductor 104. In other embodiments, the first and second layers 104a, 104b may not be equal in thickness and width. In other embodiments, the inductor 104 may comprise any number of conductive layers.

Via structures such as those depicted in FIG. 1B, for example, may physically and electrically couple the conductive layers 104a, 104b to each other. In an embodiment the inductor 104 may comprise an ACI inductor, and may be portion of a voltage regulator circuitry, which is electrically coupled through traces (not shown) located within the package substrate 102 to voltage regulator circuitry that is located within a die that may be subsequently attached to the first side 103 of the substrate 102 (not shown). The inductor 104 may be within the footprint of a die, such as the die in FIG. 1A, for example.

Figure 3C:
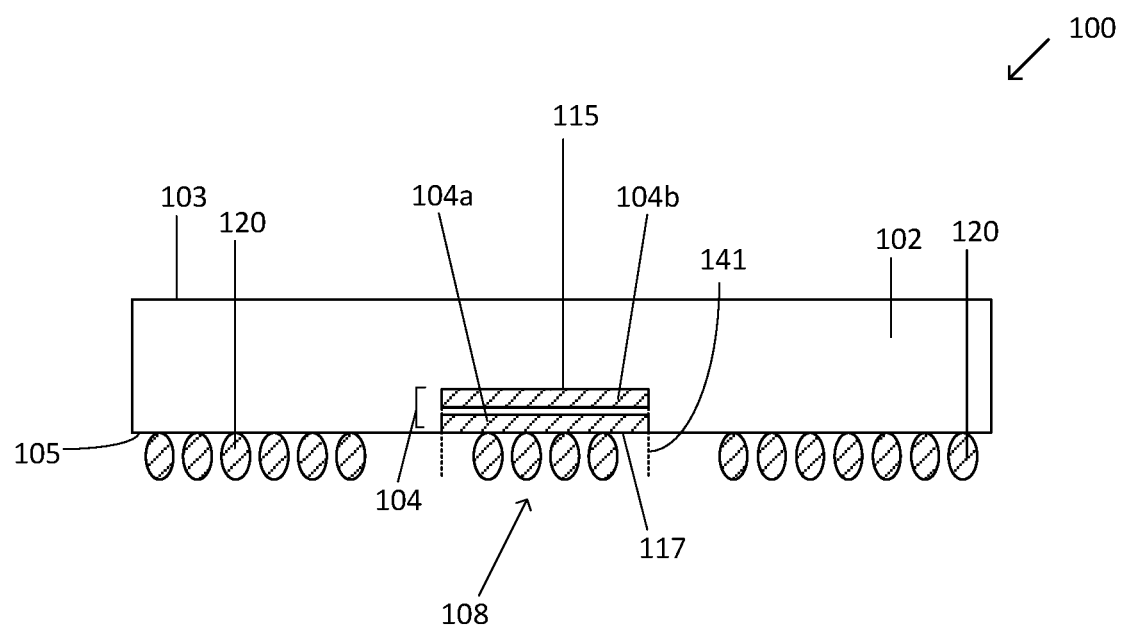

In FIG. 3C, one or more thermal interconnect structures 108 may be formed on the surface of the inductor 104. The thermal interconnect structures 108 may be formed by using solder materials, such as tin, silver, gold, nickel, for example in an embodiment. Other thermally conductive materials may be used to form the thermal interconnect structures 108. The thermal interconnect structures 108 may comprise any shape, such as a spherical shape or a rectangular shape, for example. The thermal interconnect structures 108 may be formed using metallization processing such as physical vapor deposition or plating processing. The thermal interconnect structures 108 may comprise a thickness of between about X and about Y. The thermal interconnect structures 108 are within a footprint of a die to be mounted on the first side 103 of the substrate 102. The thermal interconnect structures 108 are within a footprint 141 of the inductor 104 as well. Solder interconnect structures 120 are attached adjacent to the thermal interconnect structures 108 on the second side 105 of the substrate 102 by using a solder reflow process, for example.

Figure 3D:
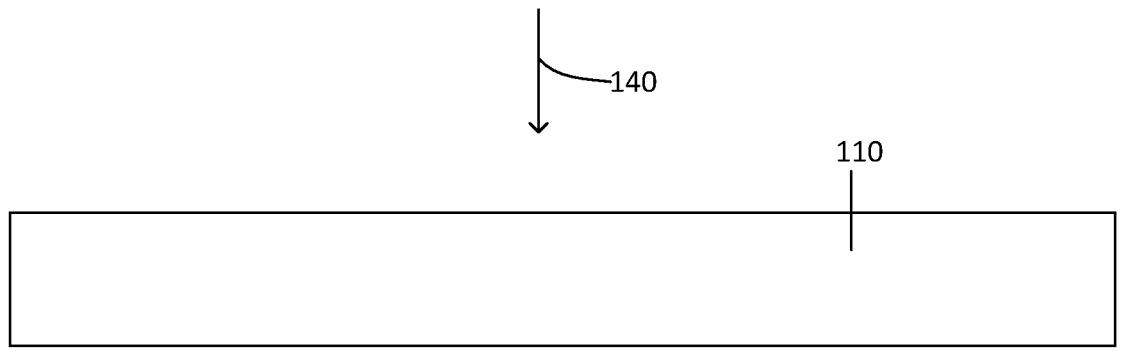

In FIG. 3D, a board 110 is provided, where the board 110 may comprise a motherboard or a printed circuit board, for example. The board 110 may be any suitable substrate with which to attach the package substrate 102 thereto, as needed for particular design requirements. A process 140 may be applied to the board, where the process 140 may include forming a recess (not shown) on a first side 109 of the board 110. Board conductive features may be formed within the recess.

Figure 3E:
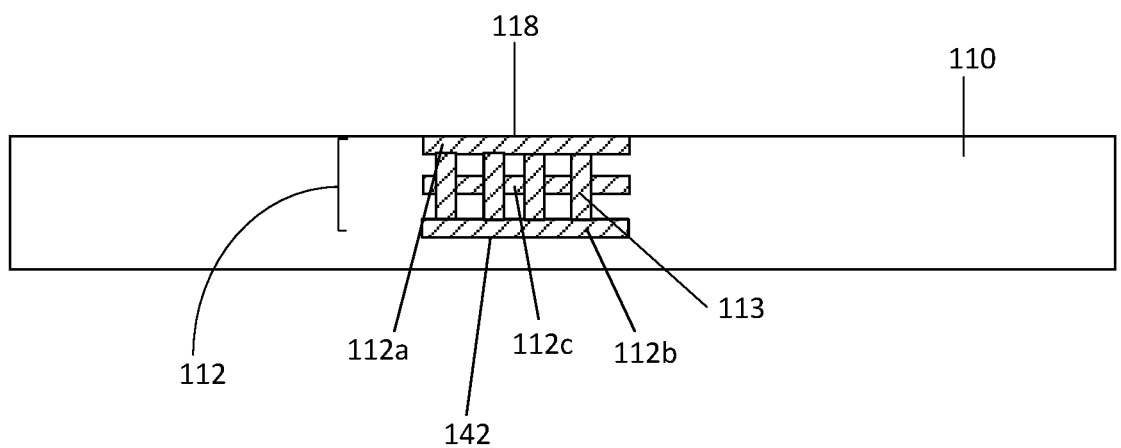

FIG. 3E depicts the board conductive features 112 as formed within the board 110, and may comprise a first side 118 and a second side 142. The one or more board conductive features 112 are at least partially embedded within the board 110. The board conductive features 112 may comprise any number of board conductive layers 112a, 112b, 112c, in an embodiment. A first board conductive feature 112a may be formed such that a surface 118 of the first board conductive layer 112a (which may comprise a first side/surface of the board conductive feature 112) is substantially coplanar with the first side 109 of the board 110. The board conductive feature 112 may comprise a length and a width, and in an embodiment, the first conductive layer 112a of the board conductive feature 112 may comprise a length and a width, where the length and width of the first board conductive layer 112a is substantially the same as the length and the width of the first inductor layer 104a. The board conductive layers 112 are mirror images of the inductor conductive layers 104a, in an embodiment.

The board conductive features 112 may be formed using physical vapor deposition or plating processes as required by particular design rules. The board conductive features 112 may be formed of any suitable conductive materials, and/or thermally conductive materials. The board conductive features 112 may be within the footprint of a die disposed on the first surface 103 of the package substrate 102, as shown in FIG. 1A. Each of the individual board conductive features are physically and electrically coupled to each other by via structures 113. The via structures 113 may be formed by utilizing any suitable patterning and deposition techniques, as are known in the art.

Figure 3F:
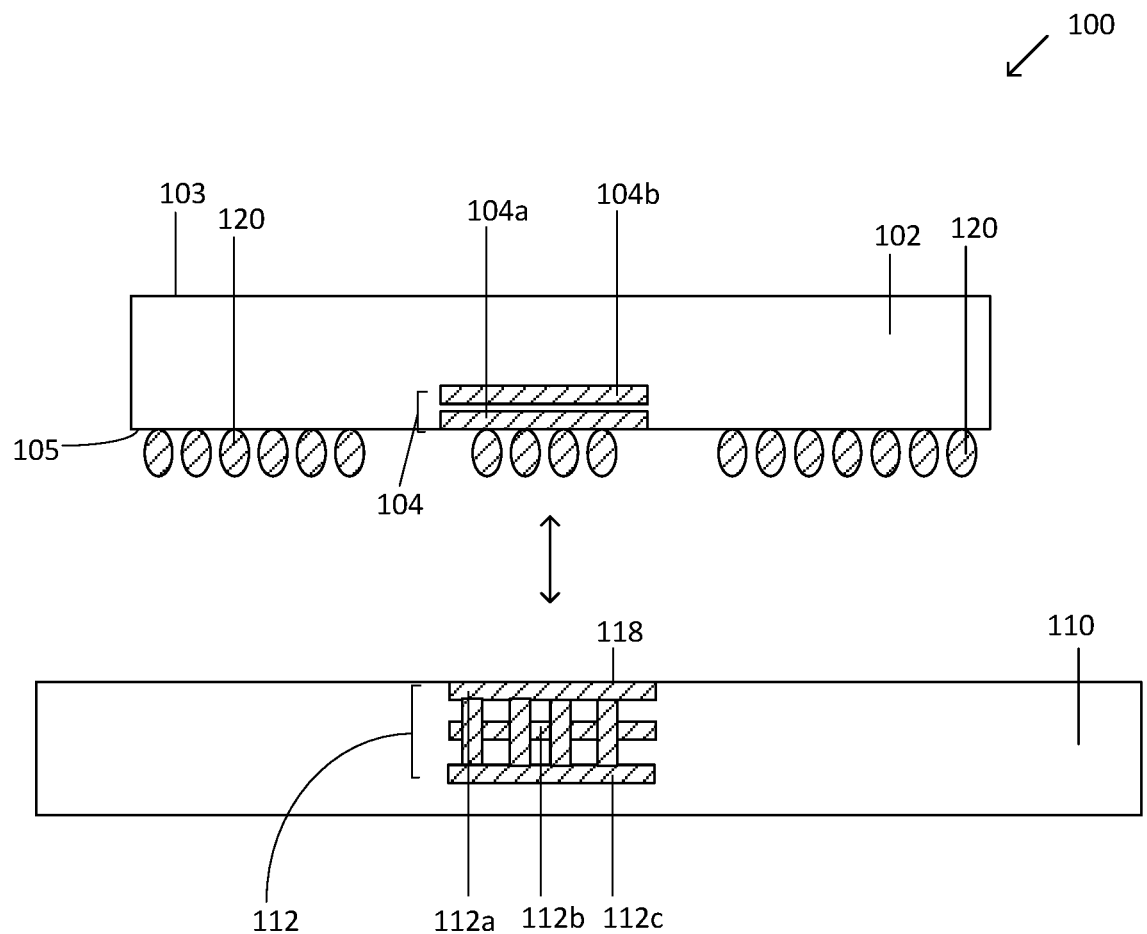

FIG. 3F depicts the package structure 100 being attached to the board 110. The thermal interconnect structures 108 are placed directly on the exposed surface 118 of the board conductive features 112. The solder interconnect structures 120 that are on the second side 105 of the substrate 102 are placed on the first side 109 of the board 110, adjacent to the thermal interconnect structures 108, by using any suitable attachment process.

Figure 3G:
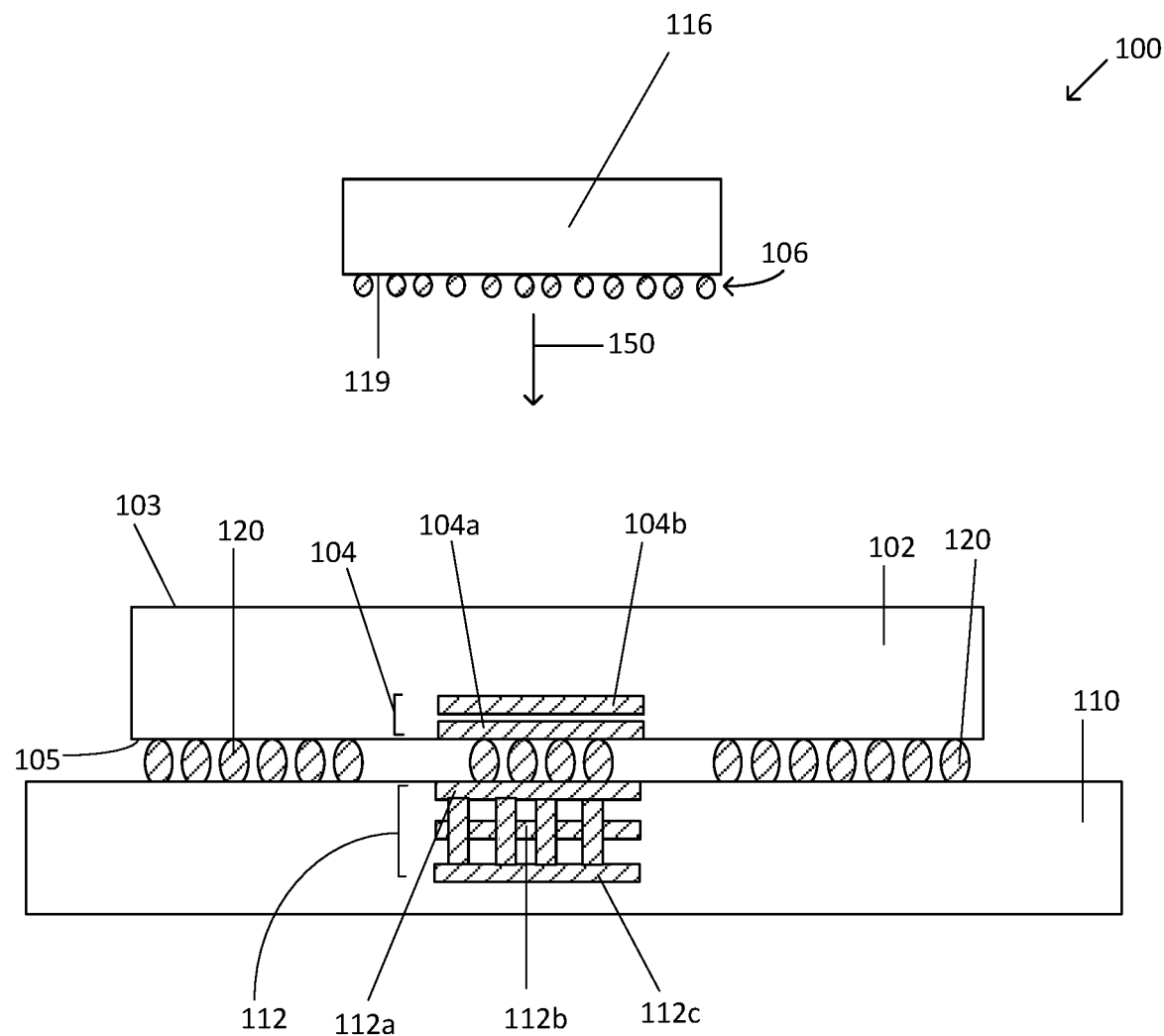

FIG. 3G depicts a first side 119 of a die 116 being attached to the first side 103 of the substrate 102, where the die 116 may comprise an integrated circuit die, in an embodiment. The die 116 may comprise various types of materials, such as conductive, dielectric and semiconductor materials. The die 116 may include any number of circuit elements, such as any type of transistor elements and/or passive elements. The individual die 116 may comprise n-type and/or p-type transistors, which may include materials such as silicon, germanium, indium, antimonide, lead telluride, indium arsenide, indium phosphide, gallium arsenide, or gallium antimonide, for example. The individual die may include such structures as planar transistors and/or nonplanar transistors, such as FinFET transistors, nanowire transistors or nanoribbon transistors.

The attachment process 150 may comprise any suitable die attachment process, where a plurality of interconnect features 106 on the first side 119 of the die 116, may be joined to interconnect features/pads (not shown) that are on the first side 103 of the substrate 102. Active surfaces of the die 116 may be attached to the first side 103 of the substrate 102, wherein conductive contacts of various integrated circuit devices, such as transistor devices, for example, may be available for connection to the package substrate 102. The inductor 104, thermal interconnects structures 108, and the board conductive features 112 are all underneath the die 116 footprint, in an embodiment.

Figure 4:
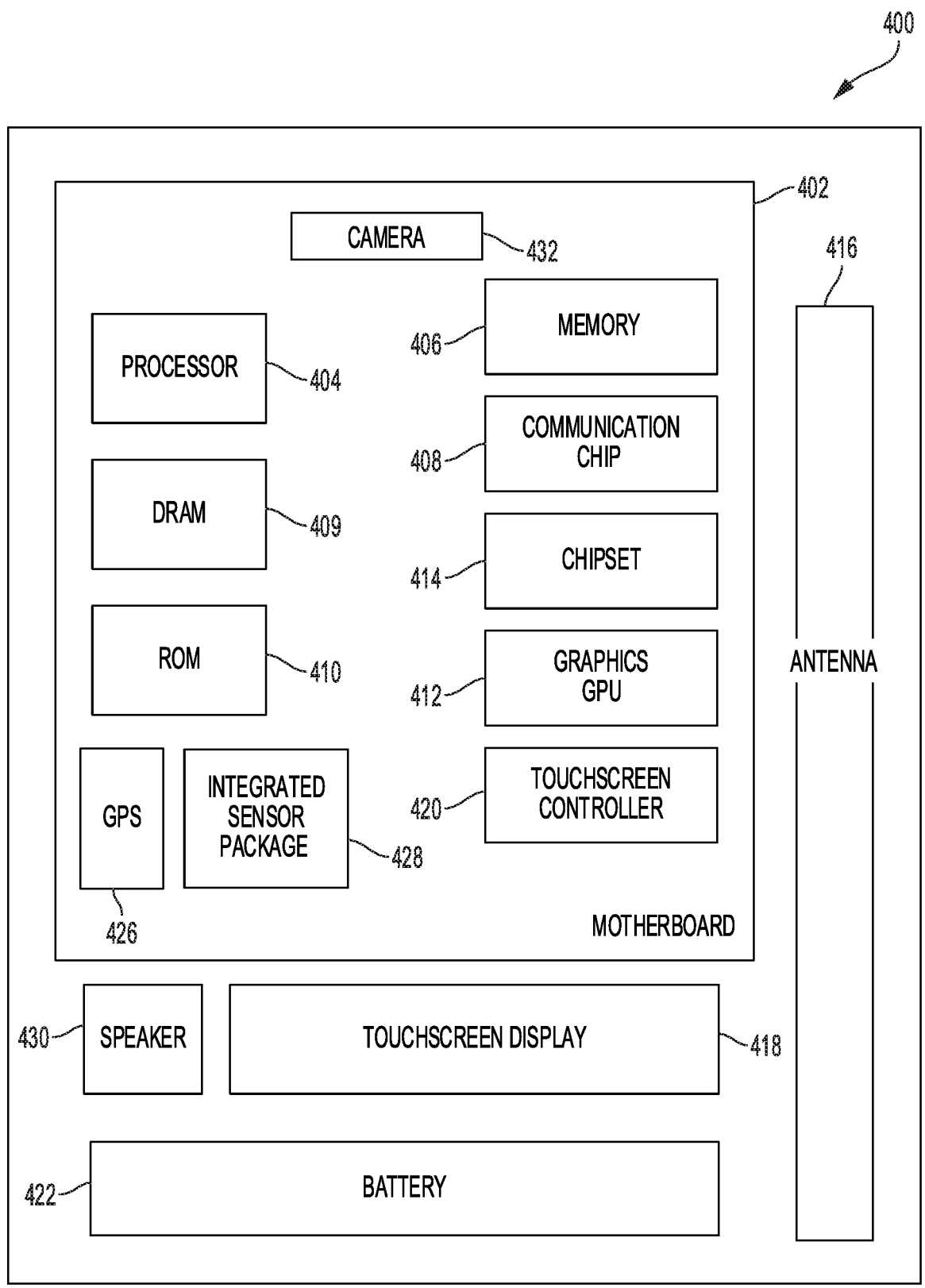
FIG. 4 is a functional block diagram of a computing device employing packaging structures having thermal interconnect structures, in accordance with embodiments.

FIG. 4 is a schematic of a computing device 400 that may be implemented incorporating the package structures described in any of the embodiments herein comprising thermal interconnect structures thermally coupled between a package inductor and board conductive features on a board, such as those depicted in FIG. 1A, for example. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, an integrated sensor 428, a speaker 430, a camera 432, an amplifier (not shown), compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments herein are not limited to the embodiments so described, but can be practiced with modification and alteration without departing from the scope of the appended claims.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should, therefore, be determined with reference to the appended claims, along with the full scope of equivalents to which such claims are entitled.

What is claimed is:

1. A microelectronic package structure comprising:
a substrate;
a die on a first side of the substrate, the die comprising an integrated circuit;
an inductor, wherein the inductor comprises a first side and a second side opposite the first side, wherein the second side is at least partially embedded in the substrate, and wherein the first side of the inductor is substantially coplanar with a surface of the second side of the substrate, wherein the inductor comprises a first conductive layer over a second conductive layer coupled to each other by a conductive via structure;
a board, wherein a first side of the board is physically and electrically coupled to the second side of the substrate;
a board conductive feature, wherein a first side of the board conductive feature is substantially coplanar with the first side of the board, and wherein a second side of the board conductive feature is at least partially embedded within the board, wherein the board conductive feature comprises a first board conductive layer over a second board conductive layer, wherein the first conductive layer of the inductor is substantially coplanar with the second side of the substrate, and wherein the first board conductive layer is substantially coplanar with the first side of the board, and wherein a thickness of the first conductive layer of the inductor is substantially the same as a thickness of the first board conductive layer; and one or more thermal interconnect structures between the first side of the inductor and the first side of the board conductive feature, wherein the inductor is thermally coupled to the board conductive feature.

2. The microelectronic device package structure of claim 1, wherein the first conductive layer of the inductor and the first board conductive layer are within a footprint of the die.

3. The microelectronic package structure of claim 1, wherein the first conductive layer of the inductor comprises a length that is substantially equal to a length of the first board conductive layer.

4. The microelectronic package structure of claim 1, wherein the first board conductive layer is a mirror image of the first conductive layer of the inductor, wherein the mirror image is a reflection through a central portion of the one or more thermal interconnect structures.

5. The microelectronic package structure of claim 1, wherein a sidewall of the first conductive layer of the inductor is in alignment with a sidewall of the first board conductive layer.

6. The microelectronic package structure of claim 1, wherein the die includes a portion of a voltage regulator, and wherein the inductor is electrically coupled to the voltage regulator.

7. The microelectronic package structure of claim 1 wherein the one or more thermal interconnect structures are within a footprint of the die.

8. An assembly comprising:
a board, the board comprising a board conductive feature, wherein a surface of the board conductive feature is coplanar with a surface of the board;
a microelectronic device package electrically coupled to the board, the microelectronic device package comprising:
a substrate;
an inductor, wherein a surface of the inductor is substantially coplanar with a surface of the substrate, wherein the inductor comprises a first conductive layer over a second conductive layer coupled to each other by a conductive via structure;
a board conductive feature, wherein a first side of the board conductive feature is substantially coplanar with the first side of the board, and wherein a second side of the board conductive feature is at least partially embedded within the board, wherein the board conductive feature comprises a first board conductive layer over a second board conductive layer, wherein the first conductive layer of the inductor is substantially coplanar with the second side of the substrate, and wherein the first board conductive layer is substantially coplanar with the first side of the board, and wherein a thickness of the first conductive layer of the inductor is substantially the same as a thickness of the first board conductive layer; and
one or more thermal interconnect structures between the surface of the inductor and surface of the board conductive feature.

9. The assembly of claim 8, wherein the inductor is thermally coupled to the board conductive feature.

10. The assembly of claim 9, wherein one or more solder balls are between the substrate and the board, and are adjacent a footprint of the die.

11. The assembly of claim 9, wherein at least a portion of the board conductive feature is a mirror image of at least a portion of the inductor, wherein the mirror image is a reflection through a center portion of the one or more thermal interconnect structures.

12. The assembly of claim 8, wherein a die is on a first side of the substrate, the die comprising a processor, wherein the processor comprises voltage regulator circuitry, and wherein the inductor is electrically coupled to the voltage regulator circuitry.

13. The assembly of claim 8, wherein the inductor comprises an air core inductor.

14. The assembly of claim 8 wherein the inductor is within the footprint of the die.

15. A method of fabricating a microelectronic package structure, comprising:
forming an inductor within a portion of a substrate, wherein a surface of the inductor is substantially coplanar with a surface of the substrate, wherein the inductor comprises a first conductive layer over a second conductive layer coupled to each other by a conductive via structure;
attaching one or more thermal interconnect structures on the surface of the inductor;
forming a conductive feature within a board, wherein a surface of the conductive feature is substantially coplanar with a surface of the board, wherein a first side of the conductive feature is substantially coplanar with the first side of the board, and wherein a second side of the conductive feature is at least partially embedded within the board, wherein the conductive feature comprises a first board conductive layer over a second board conductive layer, wherein the first conductive layer of the inductor is substantially coplanar with the second side of the substrate, and wherein the first board conductive layer is substantially coplanar with the first side of the board, and wherein a thickness of the first conductive layer of the inductor is substantially the same as a thickness of the first board conductive layer; and
placing the one or more thermal interconnect structures on the surface of the conductive feature of the board.

16. The method of fabricating the microelectronic package structure of claim 15, wherein forming the inductor comprises forming a plurality of inductor conductive layers within the substrate, wherein individual conductive layers are coupled to each other by one or more via structures.

17. The method of fabricating the microelectronic package structure of claim 15 further comprising attaching a die on a side of the substrate opposite the inductor, wherein the die includes a portion of a voltage regulator, and wherein the voltage regulator is electrically coupled to the inductor.

18. The method of fabricating the microelectronic structure of claim 17, wherein attaching the die comprises attaching the die over the inductor, wherein a footprint of the conductive feature is within a footprint of the die, and wherein a length of the surface of the conductive feature is substantially equal to a length of the surface of the inductor.

* * * * *